(12) United States Patent
Lifka et al.

(10) Patent No.: US 11,393,943 B2
(45) Date of Patent: Jul. 19, 2022

(54) PHOTOVOLTAIC PRODUCT AND METHOD OF MANUFACTURING THE SAME

(71) Applicant: Nederlandse Organisatie voor toegepast-natuurwetenschappelijk onderzoek TNO, 's-Gravenhage (NL)

(72) Inventors: Herbert Lifka, Eindhoven (NL); Johan Bosman, Wellerlooi (NL); Siegfried Christiaan Veenstra, Heeze (NL)

(73) Assignee: Nederlandse Organisatie voor toegepast-natuurwetenschappelijk onderzoek TNO, 's-Gravenhage (NL)

( * ) Notice: Subject to any disclaimer, the term of this patent is extended or adjusted under 35 U.S.C. 154(b) by 0 days.

(21) Appl. No.: 17/414,251

(22) PCT Filed: Dec. 18, 2019

(86) PCT No.: PCT/NL2019/050850
§ 371 (c)(1),
(2) Date: Jun. 15, 2021

(87) PCT Pub. No.: WO2020/130816
PCT Pub. Date: Jun. 25, 2020

(65) Prior Publication Data
US 2022/0059715 A1 Feb. 24, 2022

(30) Foreign Application Priority Data
Dec. 18, 2018 (EP) ..................................... 18213589

(51) Int. Cl.
*H01L 31/05* (2014.01)
*H01L 31/043* (2014.01)
(Continued)

(52) U.S. Cl.
CPC .. *H01L 31/0516* (2013.01); *H01L 31/022441* (2013.01); *H01L 31/043* (2014.12); *H01L 31/046* (2014.12)

(58) Field of Classification Search
CPC . H01L 31/0516; H01L 31/043; H01L 31/046; H01L 31/022441
See application file for complete search history.

(56) References Cited

U.S. PATENT DOCUMENTS 3,903,427 A * 9/1975 Pack ............... H01L 31/022441
250/208.2
5,421,908 A 6/1995 Yoshida et al.
(Continued)

OTHER PUBLICATIONS

European Patent Office, International Search Report in corresponding International Application No. PCT/NL2019/050850, dated Mar. 4, 2020 (3 pages).

*Primary Examiner* — Golam Mowla
(74) *Attorney, Agent, or Firm* — Leydig, Voit & Mayer, Ltd.

(57) ABSTRACT

The present disclosure pertains to a photovoltaic product (1), comprising a foil with a photovoltaic layer stack (10) and an electrically conductive layer stack (20) that supports the photovoltaic layer stack and that in an operational state provides for a transport of electric energy generated by the photovoltaic layer stack to an external load. The electrically conductive layer stack (20) comprises a first and a second electrically conductive layer (21, 22) and an electrically insulating layer (23) arranged between the first and the second electrically conductive layer, wherein the photovoltaic layer stack (10) has first electrical contacts (PI, P2) of a first polarity that are electrically connected to the first electrically conductive background domain (210) and has second electrical contacts (N1, N2) of a second polarity opposite to said first polarity that are electrically connected
(Continued)

to the first contact areas (211), and wherein the second electrically conductive background domain (220) and one or more of the second contact areas (221) serve as electric contacts for the output clamps.

14 Claims, 15 Drawing Sheets

(51) Int. Cl.
*H01L 31/0224* (2006.01)
*H01L 31/046* (2014.01)

(56) References Cited

U.S. PATENT DOCUMENTS

| | | | |
|---|---|---|---|
| 2009/0114276 A1* | 5/2009 | Shan | H01L 31/0516 |
| | | | 257/E21.001 |
| 2009/0139570 A1* | 6/2009 | Kinoshita | H01L 31/0747 |
| | | | 136/258 |
| 2009/0301543 A1 | 12/2009 | Reddy et al. | |
| 2010/0051085 A1* | 3/2010 | Weidman | H01L 31/022441 |
| | | | 438/98 |
| 2011/0297996 A1 | 12/2011 | van den Brand et al. | |
| 2012/0103408 A1* | 5/2012 | Moslehi | H01L 31/02008 |
| | | | 257/E31.124 |
| 2012/0240995 A1* | 9/2012 | Coakley | H01L 31/0201 |
| | | | 257/E31.124 |
| 2013/0087824 A1 | 4/2013 | van den Brand et al. | |
| 2013/0160813 A1* | 6/2013 | Natarajan | H01L 31/049 |
| | | | 438/66 |
| 2015/0008474 A1 | 1/2015 | van den Brand et al. | |
| 2017/0062633 A1 | 3/2017 | Carlson et al. | |

\* cited by examiner

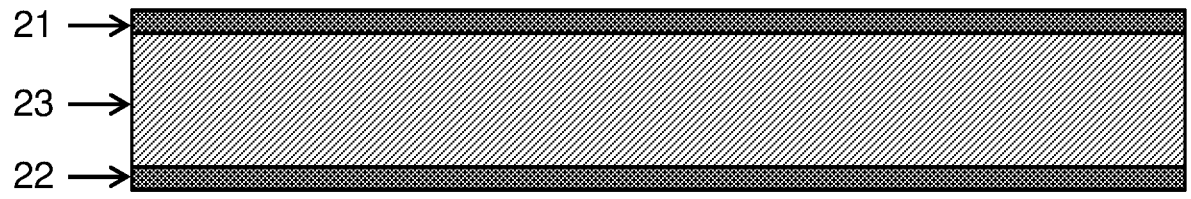
FIG. 3A    20    S21
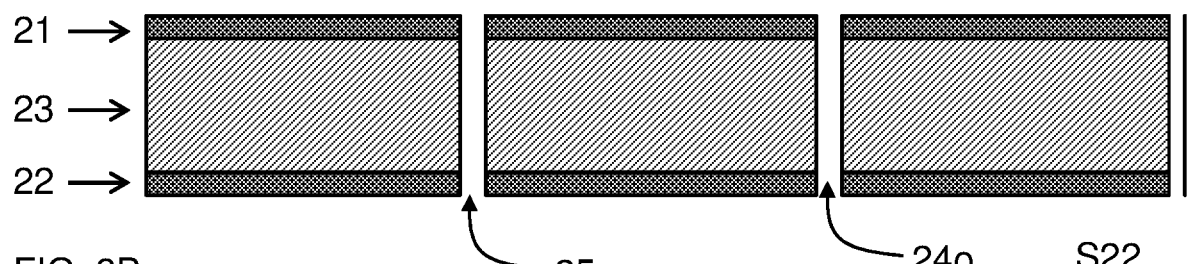
FIG. 3B    25o    24o    S22
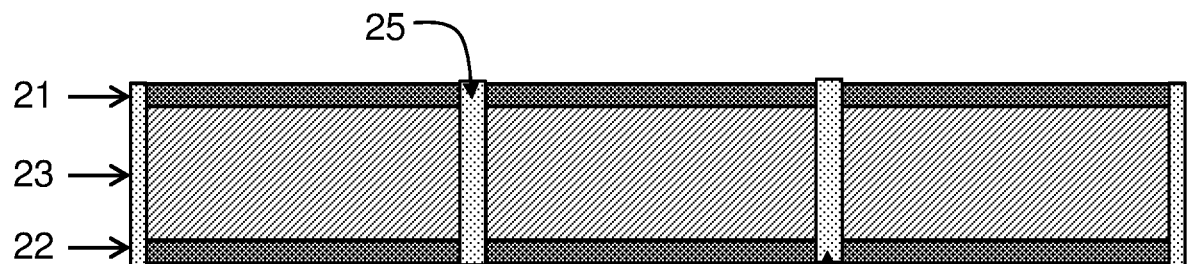
FIG. 3C    20    24    S23
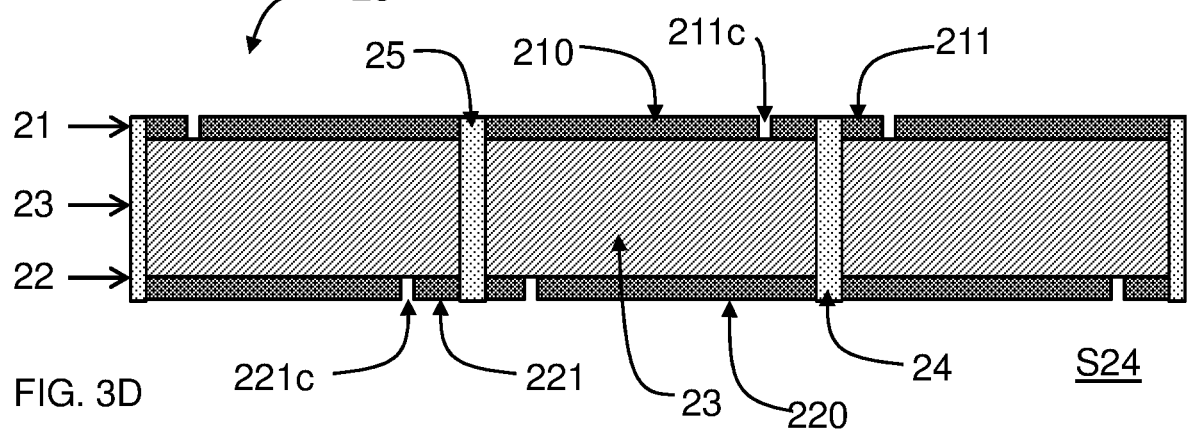
FIG. 3D    221c    221    23    220    24    S24

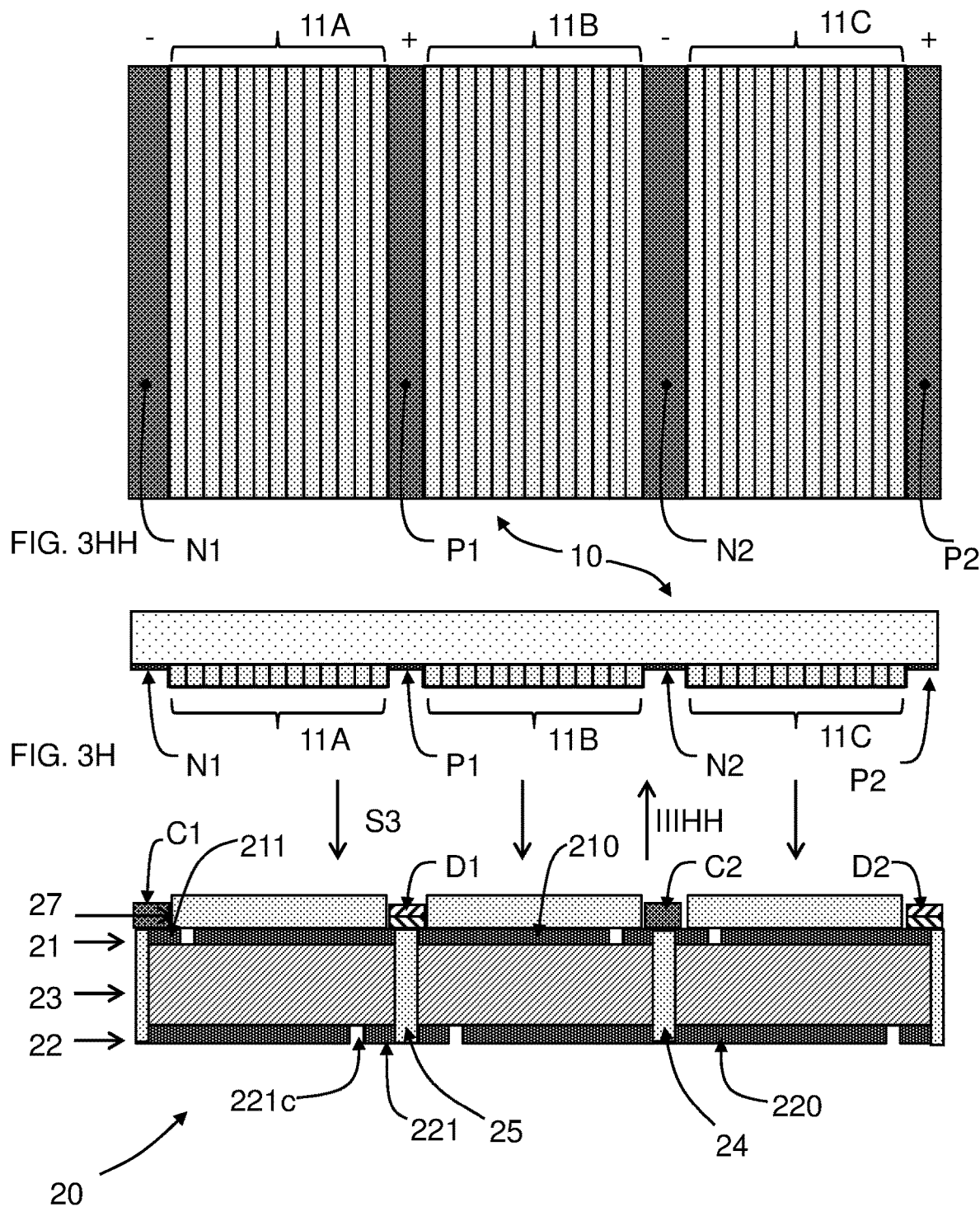

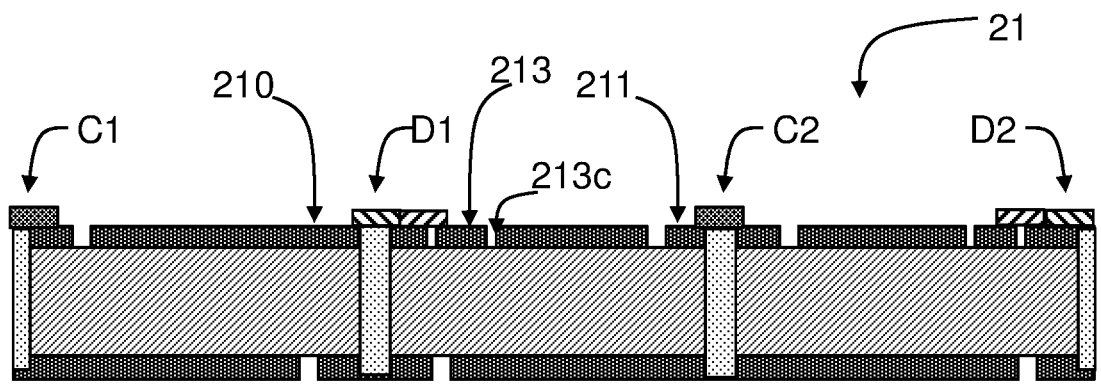
FIG. 3I1
S25A
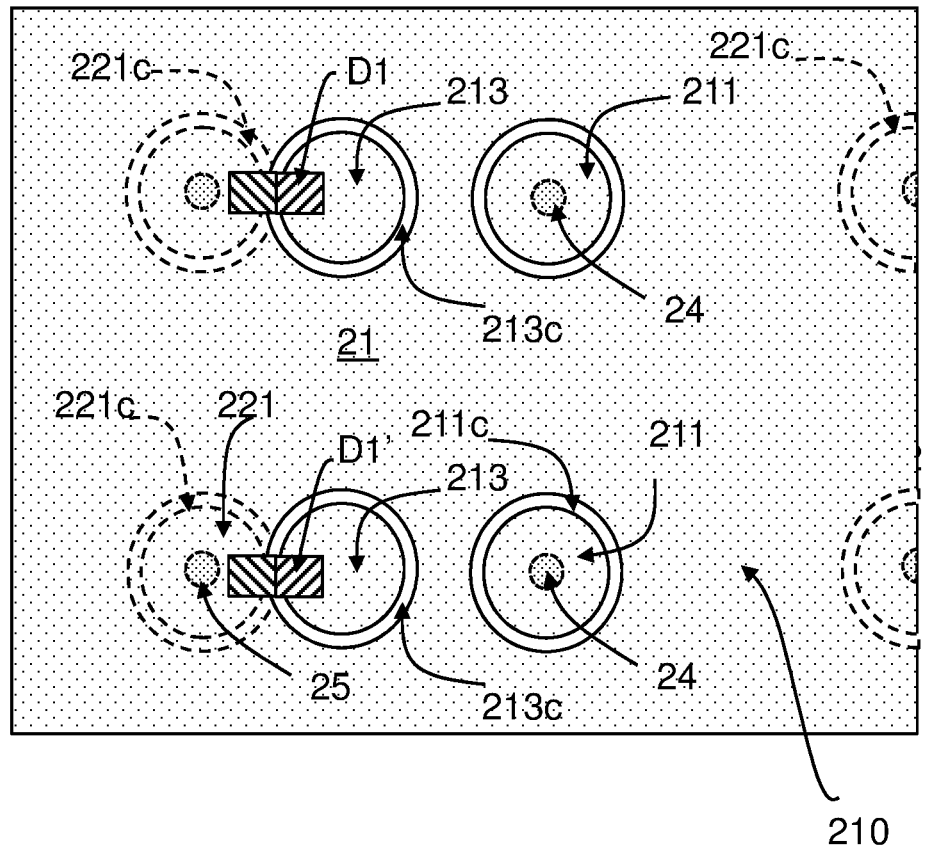
FIG. 3I2

PHOTOVOLTAIC PRODUCT AND METHOD OF MANUFACTURING THE SAME

CROSS-REFERENCE TO RELATED APPLICATIONS

This patent application is a U.S. National Phase of PCT International Application No. PCT/NL2019/050850, filed Dec. 18, 2019, which claims priority to European Application No. 18213589.7, filed Dec. 18, 2018, which are both expressly incorporated by reference in their entireties, including any references contained therein.

BACKGROUND OF THE INVENTION

Field of the Invention

The present invention pertains to a photovoltaic product.
The present invention further pertains to a method of manufacturing the same.

Related Art

Solar energy is becoming more and more important as a source of electric energy. To limit costs it is desired that installation photovoltaic systems can take place efficiently. CA2691452 specifies a solar panel system comprising a plurality of solar panels to be arranged on a roof. The panels need to be properly connected to a power conversion module. As the number of panels and their arrangement depends on the size and shape of the roof providing the proper connections to achieve the proper input voltage for the power conversion module has to take place carefully, and may be time consuming.

SUMMARY OF THE INVENTION

It is an object of the present invention to provide a photovoltaic product that facilitates a more easy installation.
It is a further object of the present invention to provide a method for manufacturing such a photovoltaic product.

According to the first object, a photovoltaic product is provided as claimed in claim 1, that comprises a foil with a photovoltaic layer stack and an electrically conductive layer stack. The electrically conductive layer stack supports the photovoltaic layer stack and in an operational state provides for a transport of electric energy generated by the photovoltaic layer stack to an external load.

The electrically conductive layer stack comprises a first and a second electrically conductive layer and an electrically insulating layer arranged between the first and the second electrically conductive layer. The electrically insulating layer may serve as a carrier for the photovoltaic product. Alternatively or additionally another layer may serve as a carrier.

The first electrically conductive layer comprises a first electrically conductive background domain and a first plurality of laterally distributed, mutually distinct contact areas which are electrically insulated from the first electrically conductive background domain.

The second electrically conductive layer also comprises a second electrically conductive background domain and a second plurality of laterally distributed, mutually distinct contact areas which are electrically insulated from the second electrically conductive background domain.

The electrically conductive layer stack further comprises a first plurality of laterally distributed electrically conducting vias that electrically interconnect respective ones of the first plurality of contact areas with the second electrically conductive background domain.

The electrically conductive layer stack still further comprises a second plurality of laterally distributed electrically conducting vias that electrically interconnect respective ones of the second plurality of contact areas with the first electrically conductive background domain.

The photovoltaic layer stack has first electrical contacts of a first polarity that are electrically connected to the first electrically conductive background domain and has second electrical contacts of a second polarity opposite to said first polarity that are electrically connected to the first contact areas. The second electrically conductive background domain and one or more of the second contact areas serve as electric contacts for the output clamps.

The photovoltaic product of claim 1 facilitates installation on arbitrary dimensioned roofs, as it is provided as a foil that can be cut into the size of the roof on which it is to be installed and provides for a predetermined output voltage regardless how it is cut. It may further be desired to restrict an output current delivered through connection clamps.

In an embodiment of the photovoltaic product the background domain of the first and/or the second electrically conductive layer is partitioned into mutually separate background domain portions which are separated from each other through an elongate region free from electrically conductive material extending in a direction transverse to an arrangement direction in which the photovoltaic units succeed each other. In that case a respective pair of output clamps may be attached at each lateral portion of the photovoltaic product corresponding to a proper background domain portions so that the current delivered through each pair of clamps is a portion of the current generated by the photovoltaic product.

In an embodiment of the photovoltaic product, the second contact areas are at least twice as large as the first contact areas. This further facilitates the installation of the product in that it is relatively easy to find the second contact areas when interconnecting the product to a power conductor. A large second contact area also contributes to a low electrical resistance in the connection with the power conductor. The electrical connection of a power conductor with the second electrically conductive background domain will be relatively easy, as the latter provides for sufficient space available for connection.

It is noted that the first contact areas may be smaller, as the latter may be connected with respective contacts of the photovoltaic layer stack in a well aligned lamination process. Also the role of the electrical resistance is less important as the photovoltaic layer stack may be interconnected with a large number of such first contact areas. The electrical connection of the photovoltaic layer stack with the first electrically conductive background domain will also be relatively easy, as the latter provides for sufficient space available for connection.

In an embodiment, the photovoltaic layer comprises a plurality of photovoltaic units that are arranged in an arrangement direction, wherein mutually subsequent photovoltaic units share a respective common electrical contact. As in this arrangement mutually subsequent photovoltaic units share a respective common electrical contact, a larger surface area remains available for photovoltaic conversion.

In an embodiment diodes are arranged between the first electrical contacts and the first electrically conductive background domain and/or between the second electrical contacts and the first contact areas, wherein the diodes are biased in accordance with the current direction as determined by the photovoltaic units in their normal operational state. The diodes prevent a flow of electric current in the direction opposite to the direction of the normal operational state, and therewith avoid a loss of energy that and possible damage that could otherwise occur if a photovoltaic unit is in a non-functional state, for example due to a shadow cast on that unit.

A method of manufacturing a photovoltaic product as claimed herein comprises providing a photovoltaic layer stack, providing an electrically conductive layer stack and laminating the photovoltaic layer stack on the electrically conductive layer stack.

The photovoltaic layer stack is provided with a plurality of photovoltaic units and with first electrical contacts of a first polarity as well as second electrical contacts of a second polarity opposite to said first polarity.

Providing an electrically conductive layer stack comprises providing an insulating layer with a first and a second electrically conductive layer at a respective one of mutually opposite surfaces of the insulating layer. The insulating layer may also serve as a carrier for the product to be manufactured.

The electrically conductive layer stack is provided with a first plurality of laterally distributed electrically conducting vias that electrically interconnect the first and the second electrically conductive layer. The electrically conductive layer stack is also provided with a second plurality of laterally distributed electrically conducting vias that electrically interconnect the first and the second electrically conductive layer. The first and the second plurality of vias may for example be provided by a combination of a first process step wherein holes are drilled, e.g by laser drilling, at the location of the vias and a subsequent second process step wherein the holes are filled with an electrically conductive material. Alternatively, an electrically conductive material may be injected directly to form the vias.

Providing an electrically conductive layer stack comprises removing material of the first electrically conductive layer along a contour of a zone around each via of the first plurality. Therewith the first electrically conductive layer is partitioned into a first electrically conductive background domain and a first plurality of laterally distributed, mutually distinct contact areas which are electrically insulated from the first electrically conductive background domain. It is noted that this step and the step of providing the vias may be reversed in order.

Providing an electrically conductive layer stack further comprises removing material of the second electrically conductive layer along a contour of a zone around each via of the second plurality. Therewith the second electrically conductive layer is partitioned into a second electrically conductive background domain and a second plurality of laterally distributed, mutually distinct contact areas which are electrically insulated from the second electrically conductive background domain. Likewise this step and the step of providing the second vias may take place in a reverse order.

Laminating comprises interconnecting the first electrical contacts of the photovoltaic layer stack with the first electrically conductive background domain of the first electrically conductive layer and interconnecting the second electrical contacts to respective first contact areas of the first electrically conductive layer.

Therewith the claimed product is obtained in an efficient manner. It is noted that the photovoltaic layer stack and the electrically conductive layer stack may be manufactured independently of each other, at mutually different locations for example and lamination may take place at again another location for example.

The method may comprise arranging diodes at the first electrically conductive background domain at the locations determined for interconnection with the first electrical contacts of the photovoltaic layer stack. Alternatively, or additionally, diodes may be arranged at the locations of the first contact areas for interconnection with the second electrical contacts of the photovoltaic layer stack. When the photovoltaic layer stack and the electrically conductive layer stack are subsequently laminated, it is achieved as a side result that the diodes are arranged between the first electrical contacts and the first electrically conductive background domain and/or between the second electrical contacts and the first contact areas.

An embodiment of the method comprises applying a layer of a polymer melt material at an interface between the photovoltaic layer stack and the electrically conductive layer stack. This facilitates a hot lamination process.

An embodiment of the method comprises providing a protective layer over the second electrically conductive layer. The protective layer provides for an electric insulation of the second electrically conductive background domain and the second plurality of laterally distributed, mutually distinct contact areas, but allows them to be exposed for connection to clamps of electric conductors to a load, or to an electric conversion device. To facilitate an identification of the locations of second contact areas, the protective layer may be provided with markings indicative for these locations.

In the process of installation, the method may further comprise separating a lateral portion of the photovoltaic foil. At one side, the cut out portion may be separated from the remainder along a line between mutually subsequent photovoltaic units.

BRIEF DESCRIPTION OF THE DRAWINGS

These and other aspects are described in more detail with reference to the drawing. Therein:

FIGS. 3A-3E, 3F, 3FF, 3G, 3GG, 3H and 3HH show steps of the method in more detail.

FIG. 3I1, 3I2 show an alternative for a step illustrated in FIG. 3E.

FIG. 4B shows a top-view of the product according to IVB in FIG. 4A FIGS. 5A and 5B schematically show a photovoltaic product which is separated as a lateral portion from the product of FIGS. 4A and 4B. Therein

DETAILED DESCRIPTION OF EMBODIMENTS

Like reference symbols in the various drawings indicate like elements unless otherwise indicated.

Figure 1:
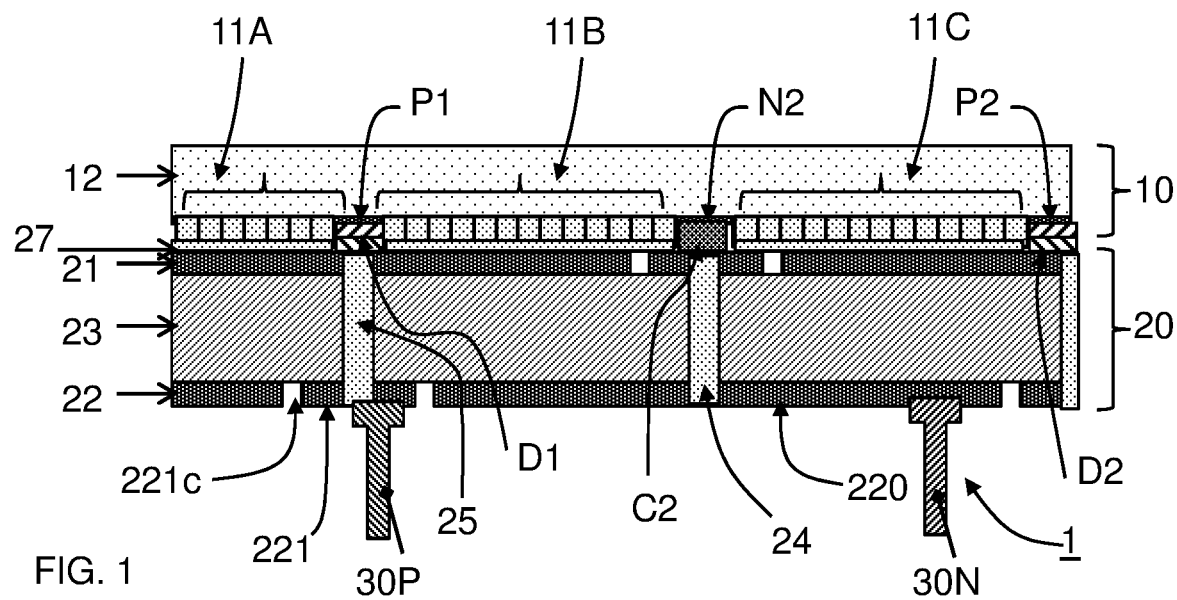
FIG. 1 schematically shows a photovoltaic product.

FIG. 1 schematically shows a photovoltaic product 1, that comprises a foil with a photovoltaic layer stack 10 with a substrate 12 and an electrically conductive layer stack 20 that supports the photovoltaic layer stack. In an operational state of the photovoltaic layer stack it provides for a transport of electric energy generated by the photovoltaic layer stack to be provided to an external load, for example via output clamps 30P, 30N.

The electrically conductive layer stack 20 comprises a first and a second electrically conductive layer 21, 22 and an electrically insulating layer 23 arranged between the first and the second electrically conductive layer. The electrically insulating layer 23 is for example a polymer layer with a thickness of a few tens to a few hundreds of micron, e.g. a PET or a PEN layer, and the electrically conductive layers 21, 22 may be provided of a metal layer having a thickness of a few to a few tens of micron, e.g. aluminum or copper layers with a thickness of 15 micron.

Figure 1A:
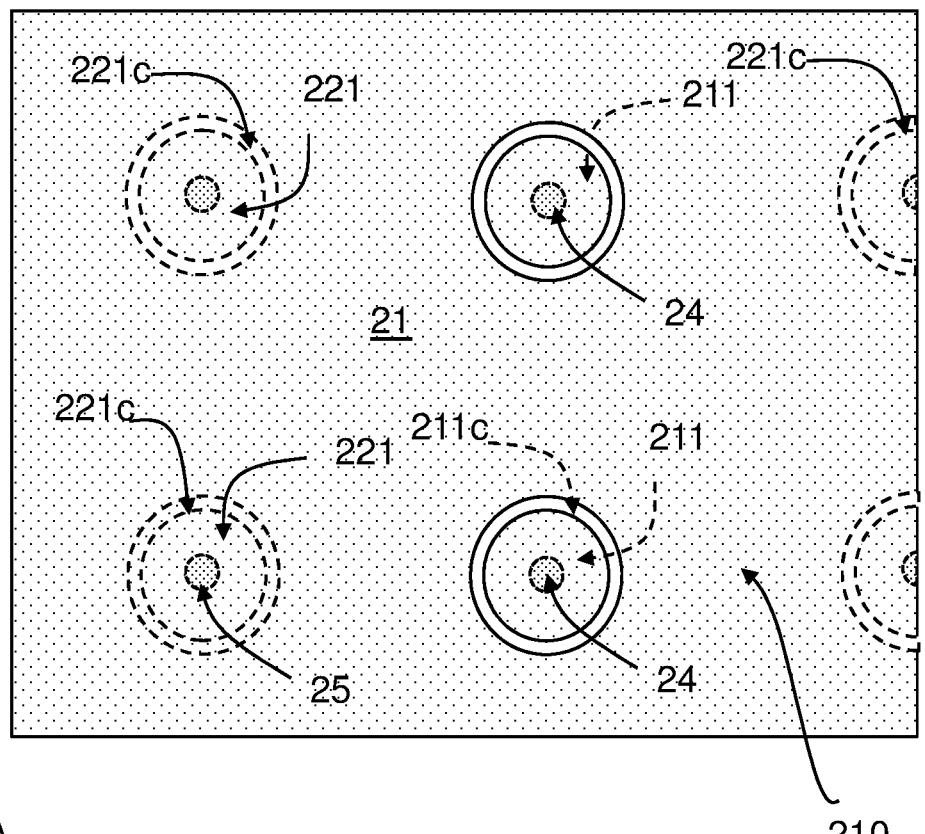
FIGS. 1A and 1B show a part of the photovoltaic product at mutually opposite sides in more detail FIGS. 2A, 2AA, 2B and 2C schematically show a method of manufacturing a photovoltaic product. Furthermore, FIG. 2AB is a symbolic representation of a photovoltaic layer stack in the photovoltaic product to be manufactured.

As shown in more detail in FIG. 1A, the first electrically conductive layer 21 comprises a first electrically conductive background domain 210 and a first plurality of laterally distributed, mutually distinct contact areas 211 which are electrically insulated from the first electrically conductive background domain 210. In the embodiment shown this is achieved in that contact areas 211 are bounded by a contour 211c wherein material of the first electrically conductive layer 21 is removed.

Figure 1B:
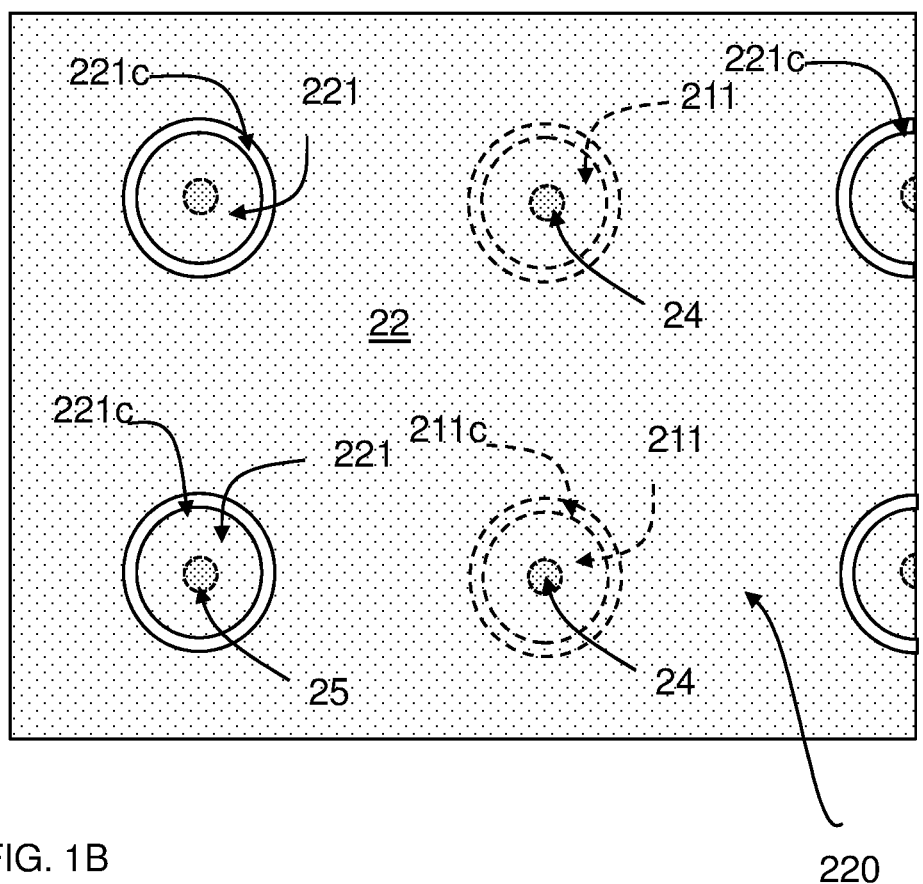

Analogously, as shown in more detail in FIG. 1B, the second electrically conductive layer 22 comprises a second electrically conductive background domain 220 and a second plurality of laterally distributed, mutually distinct contact areas 221 which are electrically insulated from the second electrically conductive background domain 220. Likewise, this is achieved in that contact areas 221 are bounded by a contour 221c wherein material of the second electrically conductive layer 22 is removed.

It would alternatively be possible to apply the pattern of contact areas within the background domain by printing an electrically conductive material in that pattern.

The electrically conductive layer stack 20 also comprises a first plurality 24 of laterally distributed electrically conducting vias that electrically interconnect respective ones of the first plurality of contact areas 211 with the second electrically conductive background domain 220. The electrically conductive layer stack 20 further comprises a second plurality 25 of laterally distributed electrically conducting vias that electrically interconnect respective ones of the second plurality of contact areas 22) with the first electrically conductive background domain 210.

The photovoltaic layer stack 10 has first electrical contacts P1, P2 of a first polarity that are electrically connected to the first electrically conductive background domain 210. The photovoltaic layer stack 10 has second electrical contacts N1, N2 of a second polarity opposite to the first polarity that are electrically connected to the first contact areas 211. The second electrically conductive background domain 220 and one or more of the second contact areas 221 serve as electric contacts for the output clamps 30N, 30P.

Figure 2A:
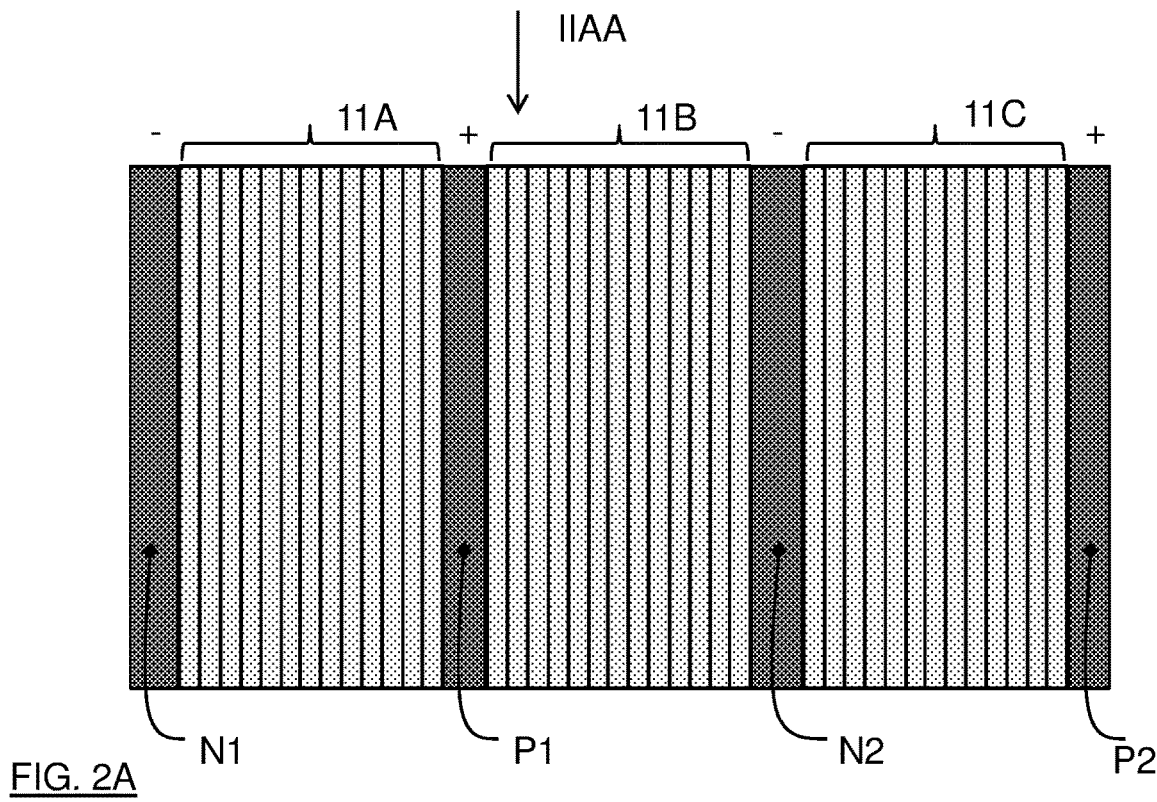
Figure 2A:
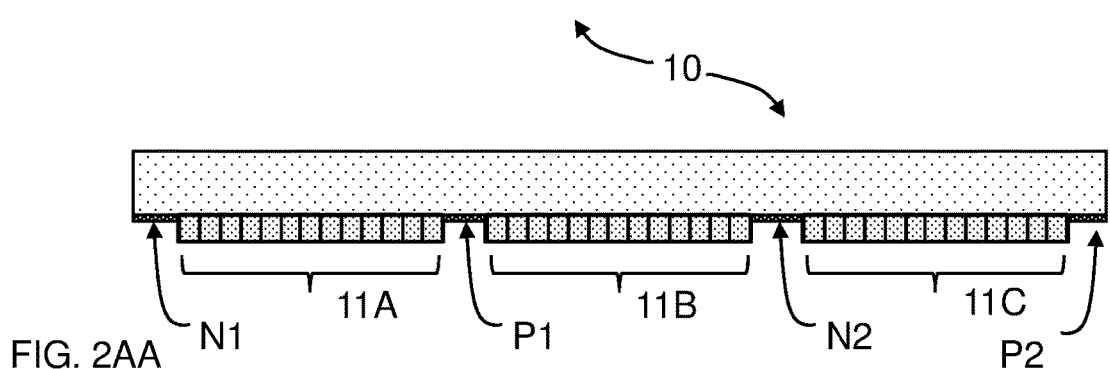
Figure 2A:
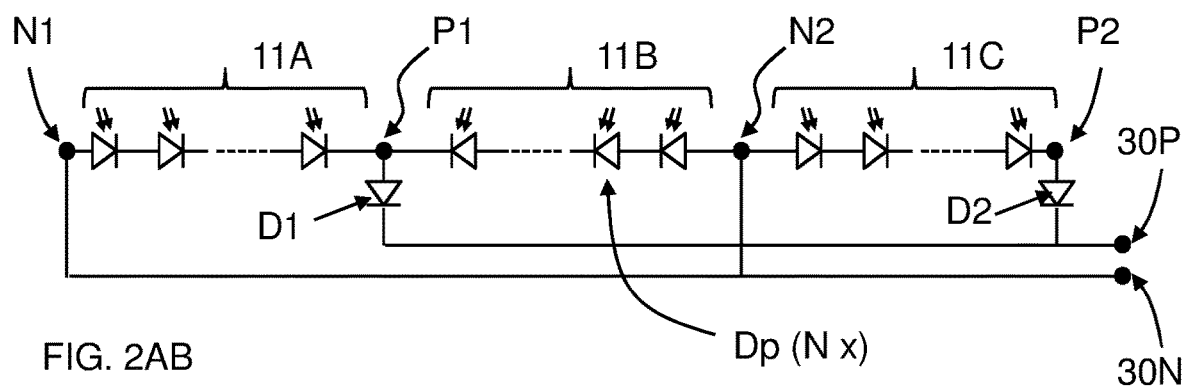

FIGS. 2A, 2AA, 2B and 2C schematically shows a method of manufacturing a photovoltaic product. FIGS. 2A and 2AA show a first main step S1 of the method, wherein a photovoltaic layer stack 10 is provided that has a plurality of photovoltaic units 11A, 11B, 11C and has first electrical contacts P1, P2 of a first polarity and second electrical contacts N1, N2 of a second polarity opposite to said first polarity. FIG. 2A shows a bottom view and FIG. 2AA shows a side view according to IIAA in FIG. 2A.

FIG. 2AB is a symbolic representation of the photovoltaic layer stack 10. As shown therein, each photovoltaic units 11A, 11B, 11C comprises a plurality N of serially arranged photodiodes Dp. The number N, e.g. in a range from 20 to 50, determines the output voltage of each unit.

Figure 2B:
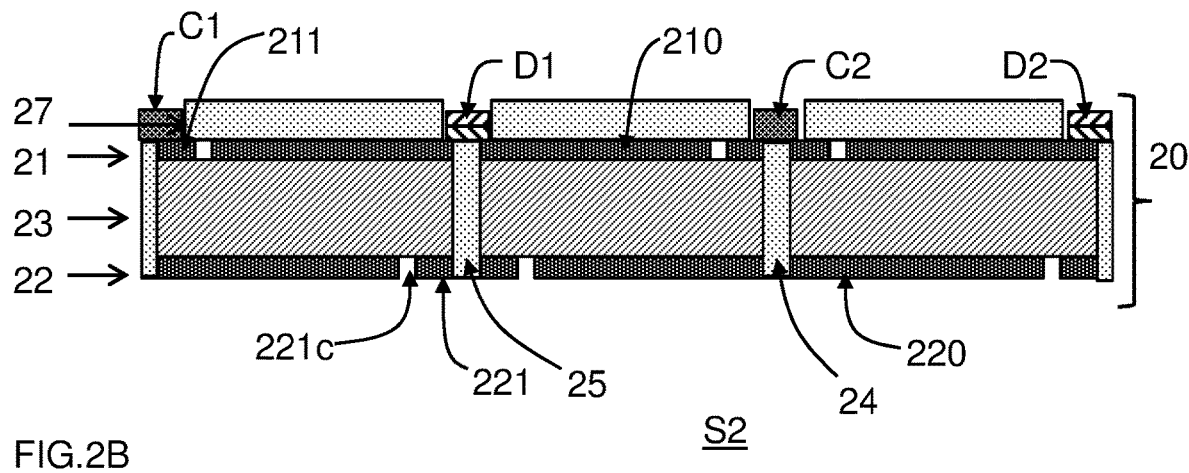

FIG. 2B schematically shows a second main step S2, wherein an electrically conductive layer stack 20 is provided. FIG. 2B shows the electrically conductive layer stack 20 in a view corresponding to the view of FIG. 2AA.

Figure 2C:
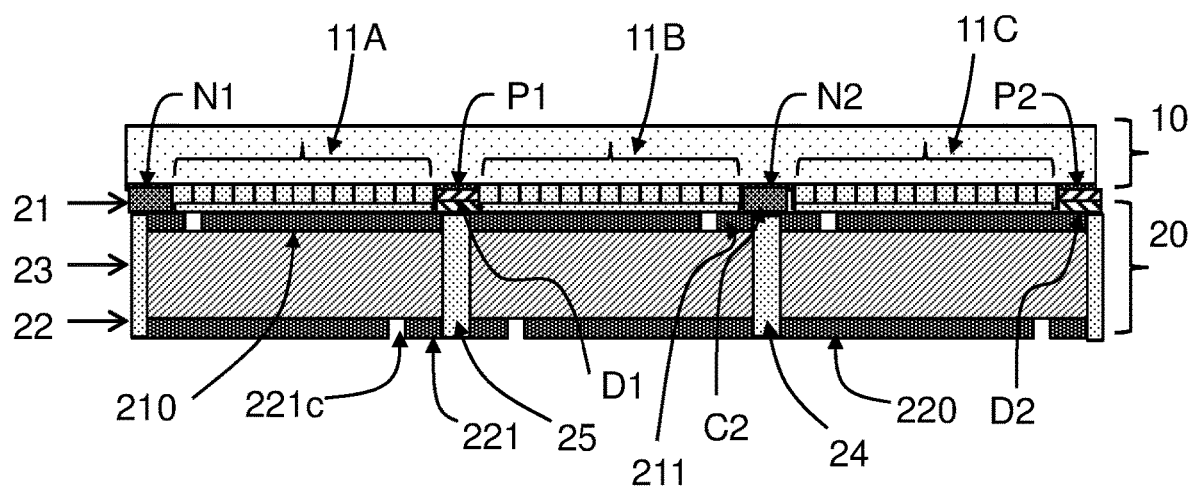

FIG. 2C schematically shows a third main step S3, wherein the photovoltaic layer stack 10 is laminated on the electrically conductive layer stack 20.

Exemplary steps comprised in main step S2 are shown in more detail in FIGS. 3A-3E, 3F, 3FF, 3G and 3GG.

FIG. 3A schematically shows step S21 of providing an insulating layer with a first and a second electrically conductive layer 21, 22 at a respective one of mutually opposite surfaces of the insulating layer 23.

FIG. 3B, 3C shows steps S22, S23, wherein a first and a second plurality of laterally distributed electrically conducting vias 24, 25 are provided that electrically interconnect the first and the second electrically conductive layer 21, 22. In the embodiment shown, FIG. 3B shows a first stage S22, wherein openings 24o, 25o are drilled, for example by laser drilling. FIG. 3C shows a second stage S23, wherein the openings 24o, 25o are filled with an electrically conductive material to form the electric connections 24, 25.

FIG. 3D shows a step S24 of partitioning the first electrically conductive layer into a first electrically conductive background domain 210 and a first plurality of laterally distributed, mutually distinct contact areas 211 which are electrically insulated from the first electrically conductive background domain. In the embodiment shown, this is achieved in that material of the first electrically conductive layer 21 is removed along a contour 211c of a zone around each via of the first plurality 24. Also in step S24, the second electrically conductive layer is partitioned into a second electrically conductive background domain 220 and a second plurality of laterally distributed, mutually distinct contact areas 221 which are electrically insulated from the second electrically conductive background domain. In the embodiment shown this is achieved by removing material of the second electrically conductive layer along a contour 212c of a zone around each via of the second plurality 25.

Alternatively, the electrically conductive layer stack may be obtained by first providing the openings 24, 25 in the insulating layer 23, subsequently applying a metal layer (e.g. by plating) over the exposed surfaces of the insulating layer 23, and subsequently insulating the contact areas from the background area, e.g. by laser ablation.

As shown in FIG. 2C, laminating S3 comprises interconnecting the first electrical contacts P1, P2 of the photovoltaic layer stack 10 with the first electrically conductive background domain 210 of the first electrically conductive layer 21 and interconnecting the second electrical contacts N1, N2 to respective first contact areas 211 of the first electrically conductive layer 21.

Figure 3E:
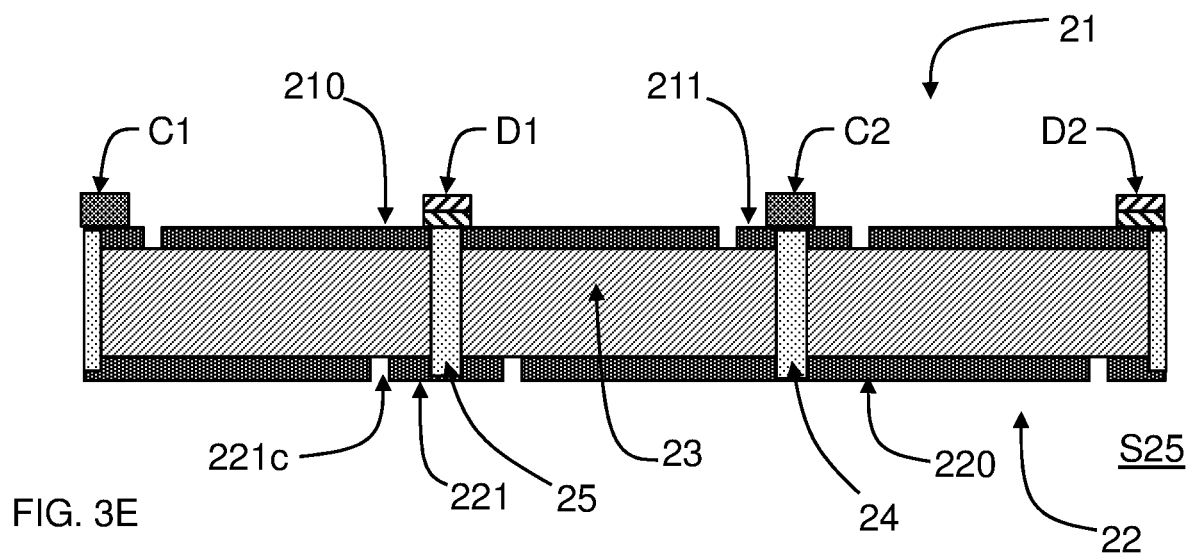

FIG. 3E shows an optional step S25 of the method wherein diodes D1, D2 are arranged at the first electrically conductive background domain 210 at the locations determined for interconnection with the first electrical contacts P1, P2 of the photovoltaic layer stack 10. Alternatively or additionally, diodes may be arranged at the locations of the first contact areas 211 for interconnection with the second electrical contacts N1, N2 of the photovoltaic layer stack 10. In this example the first contact areas are provided with metal contact elements C1 C2 having dimensions corresponding to those of the diodes.

Figure 3F:
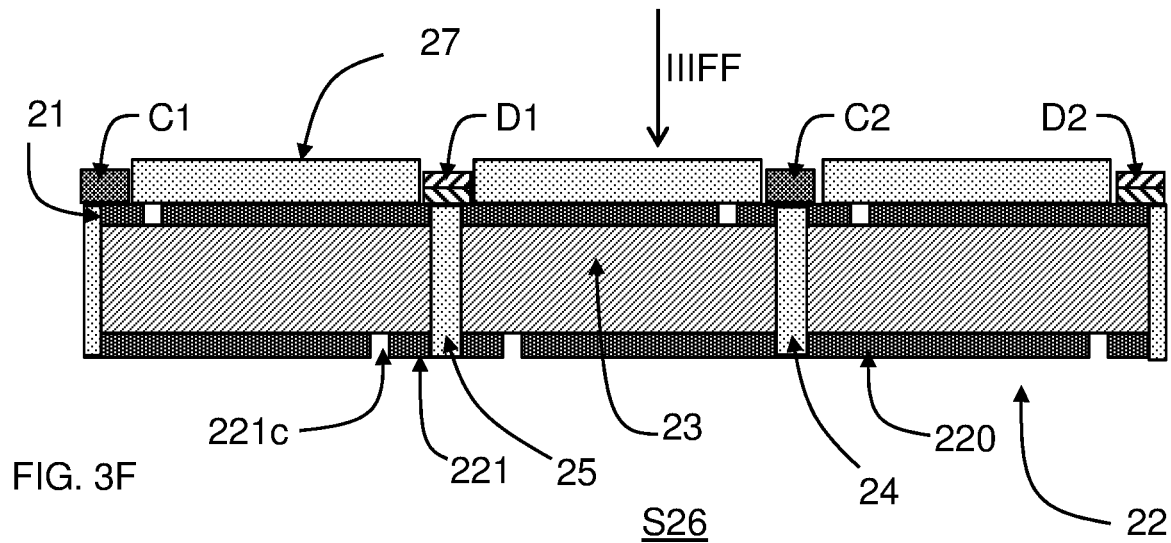
Figure 3F:
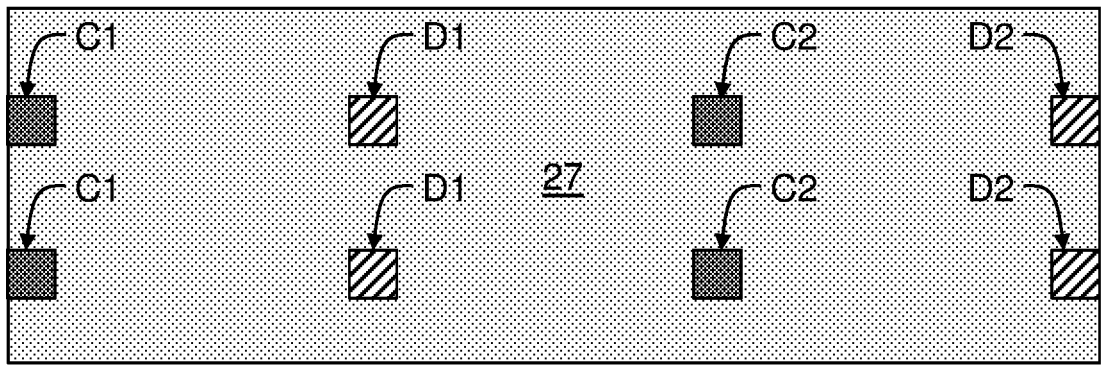

FIG. 3F shows an optional step S26 of the method wherein a layer 27 of a polymer melt material is applied on the first electrically conductive layer 21 as an interface between the electrically conductive layer stack 20 and the photovoltaic layer stack 10 to be laminated therewith. FIG. 3FF shows a top view according to IIIFF in FIG. 3F. As shown therein, layer 27 is patterned to expose the metal contact elements C1, C2 and the diodes D1, D2.

Figure 3G:
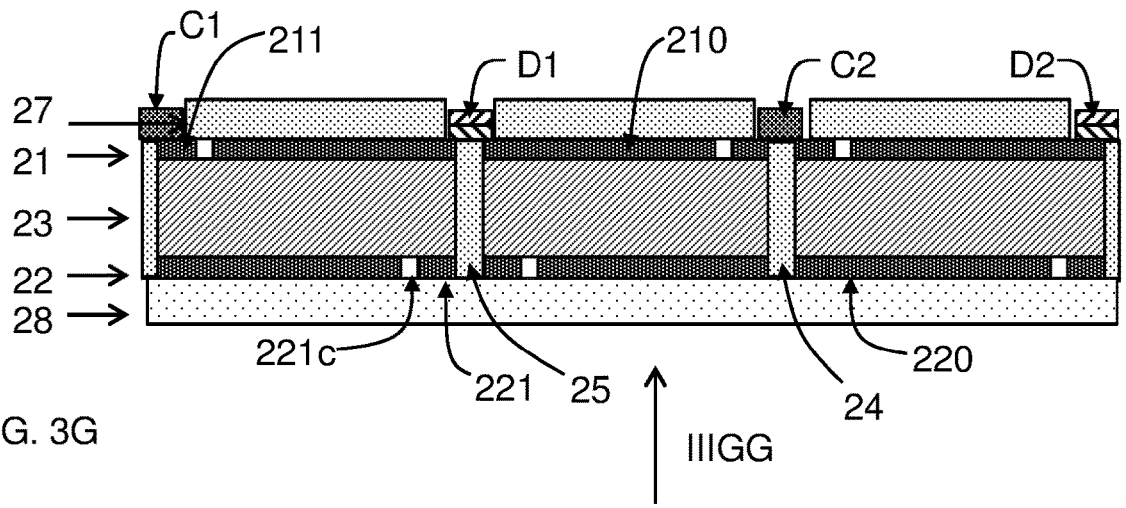
Figure 3G:
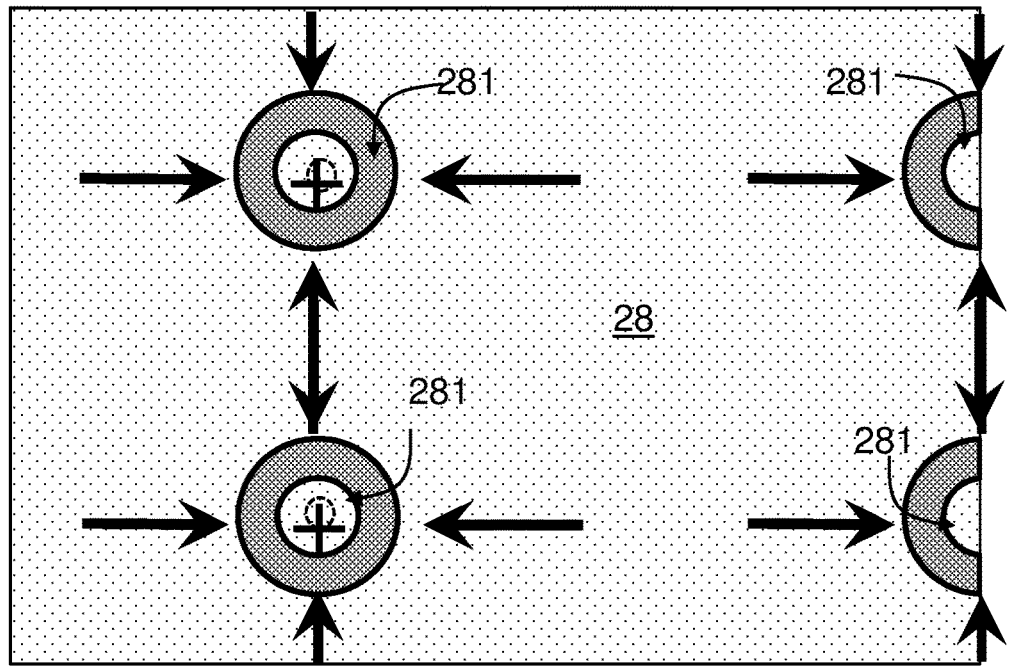

FIGS. 3G and 3GG show a further optional step S27 of the method. FIG. 3GG shows a top view according to IIIGG in FIG. 3G. In step S27 a protective layer 28 is provided over the second electrically conductive layer 22. Optionally, as can best be seen in FIG. 3GG the protective layer 28 is provided with markings 281 indicative for the location of one or more of the contact areas 221 in the second electrically conductive layer 22.

FIG. 3H shows in more detail step S3, wherein the photovoltaic layer stack 10 is laminated on the electrically conductive layer stack 20. FIG. 3HH shows a bottom view of the photovoltaic layer stack 10 according to IIIHHH in FIG. 3H.

Figure 4A:
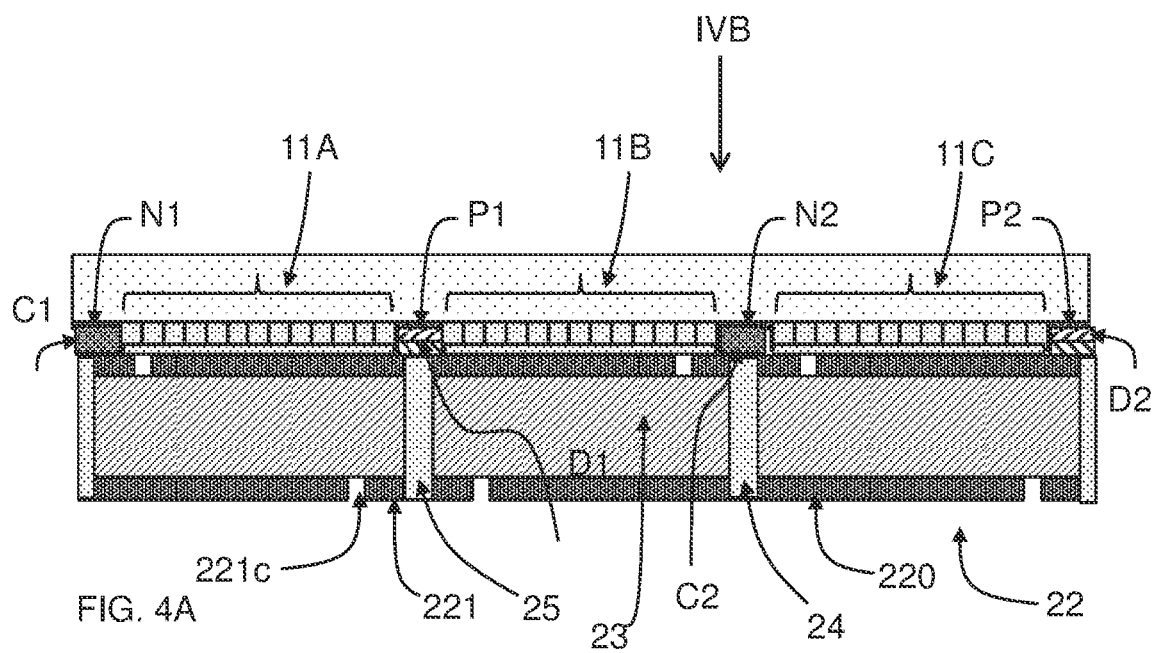
FIGS. 4A and 4B schematically show a photovoltaic product obtained after a lamination step. Therein
Figure 4B:
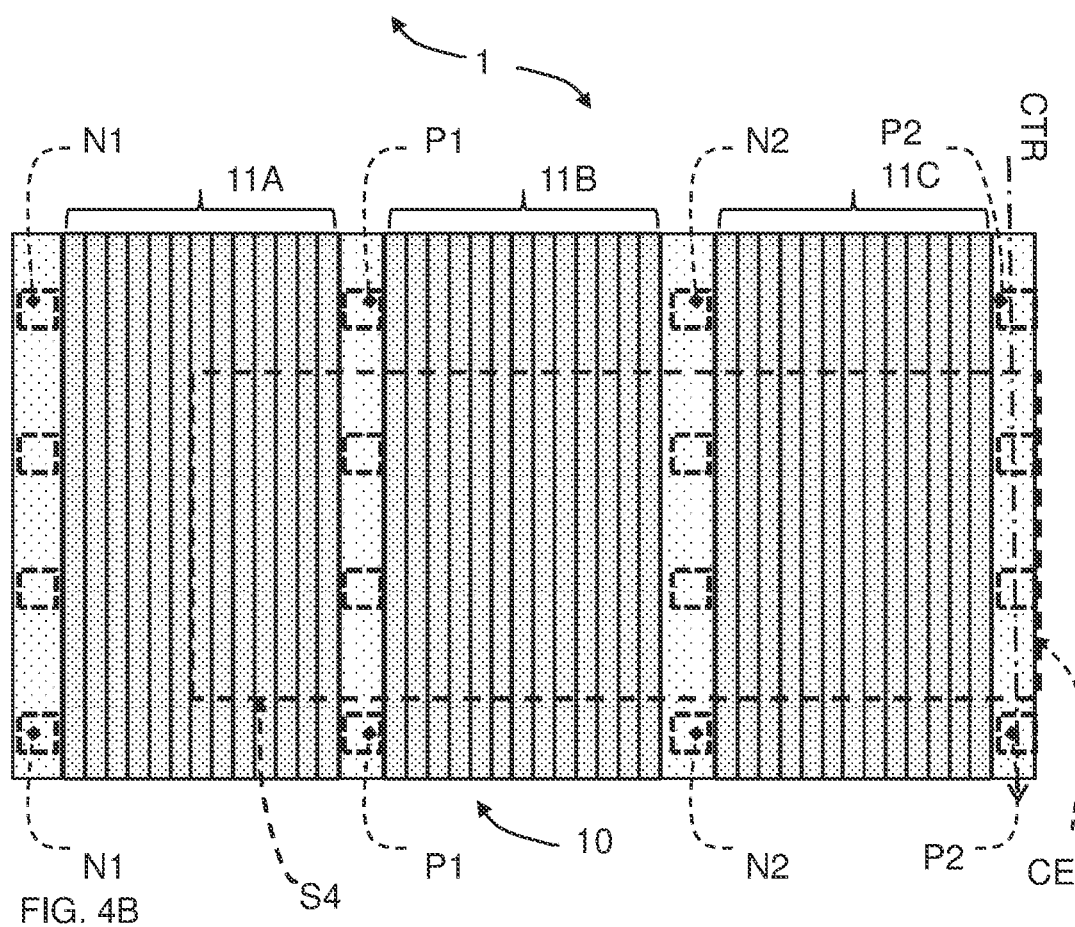

FIGS. 4A and 4B schematically show the photovoltaic product 1 obtained after the lamination. Therein FIG. 4B shows a top-view of the product according to IVB in FIG. 4A.

FIG. 4B also shows that as a further, optional step S4, a lateral portion of the photovoltaic product may be separated, for example along the contour pointed to by the arrow S4 to fit to a particular application, for example the dimensions of a roof on which the separated photovoltaic product is to be installed. Basically any contour may be chosen. Regardless the form of the separated portion, the output voltage will have a fixed value, which is determined by the number an of photodiodes Dp in each photovoltaic unit. Therewith assembly of the panels can take place with standard tools and safety measures, without having to take into account exceptional worst case circumstances that could prevail in conventional products if a very high number of cells is serially arranged. Preferably, the separated portion has at least one edge CE of its contour to include at least a portion of a row of electrical contacts, P2 in this example, but does not include a portion of a further photovoltaic unit beyond that row in an outward direction. The edge CE may for example extend along a centerline CTR through the row of contacts. Depending on the application it may not always be possible to also select the opposite edge of the contour accordingly, as is shown for example in FIG. 4B for the left side of the contour, which extends through the photovoltaic unit 11A. This implies that this photovoltaic unit 11A does not contribute to the functioning of the separated photovoltaic product. Nevertheless it, it does not impair the functioning of the other photovoltaic units 11B, 11C and it may remain for esthetical reasons. When defining the contour, it may be contemplated in which orientation the photovoltaic product can best be arranged on a roof for example to minimize a loss in efficiency due to a partitioned photovoltaic unit.

Figure 5A:
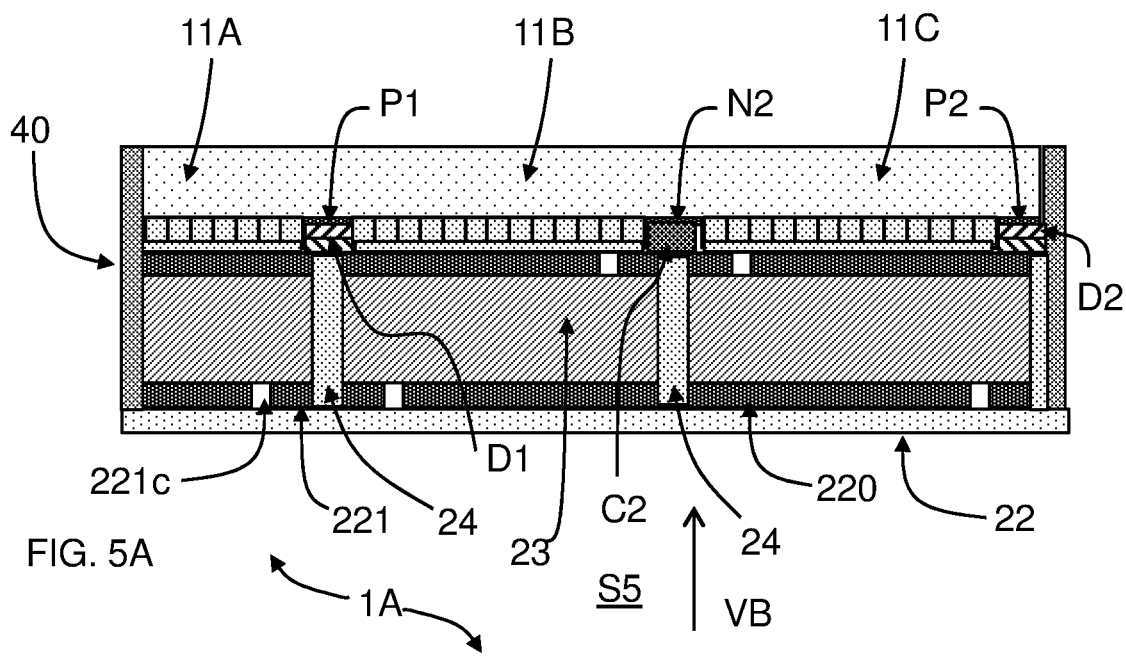
FIG. 5B shows a bottom-view of the product according to VB in FIG. 5A FIGS. 6A and 6B schematically show a result of a further step S6. Therein
Figure 5B:
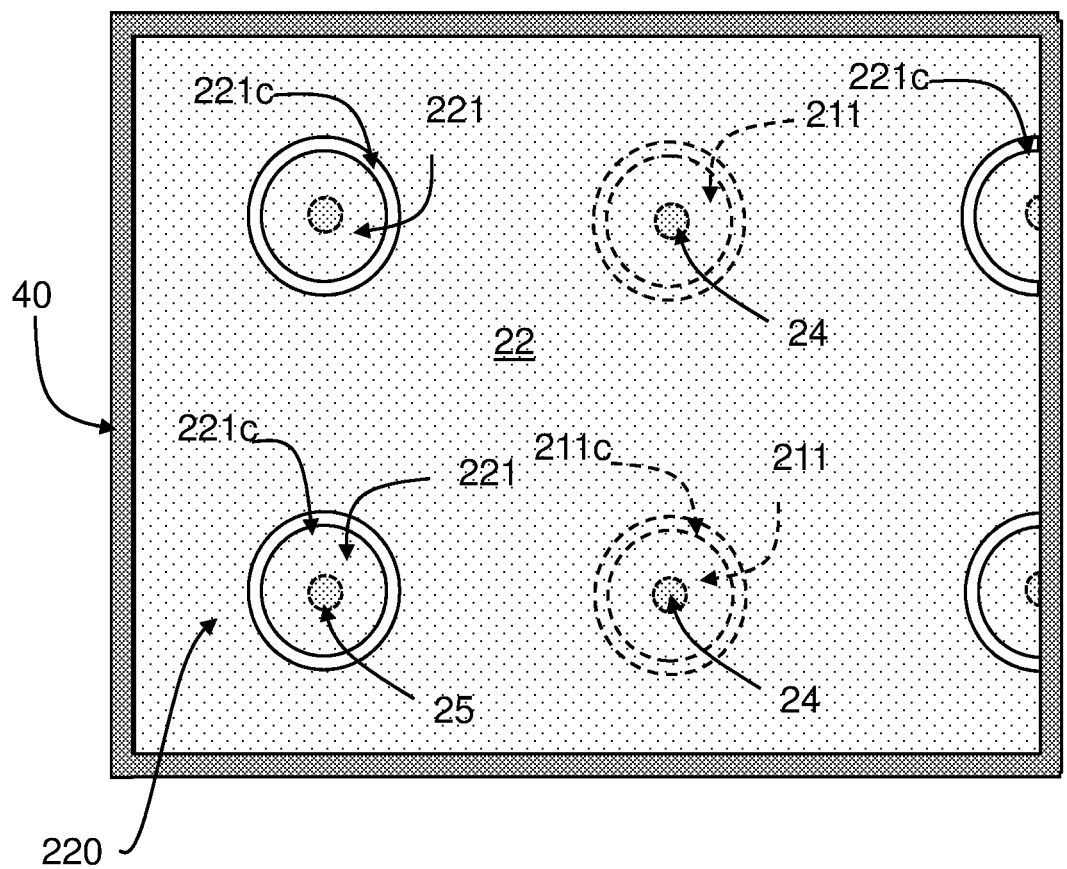

FIGS. 5A and 5B schematically show the separated photovoltaic product 1A. Therein FIG. 5B shows a bottom-view of the product according to VB in FIG. 5A. As a further step S5, a side protection 40 is provided around the edges of the separated photovoltaic product 1A. Melting a side protection, glob top materials, e.g. as provided by Epotek, a rubber strip or other methods are possible for this purpose.

Figure 6A:
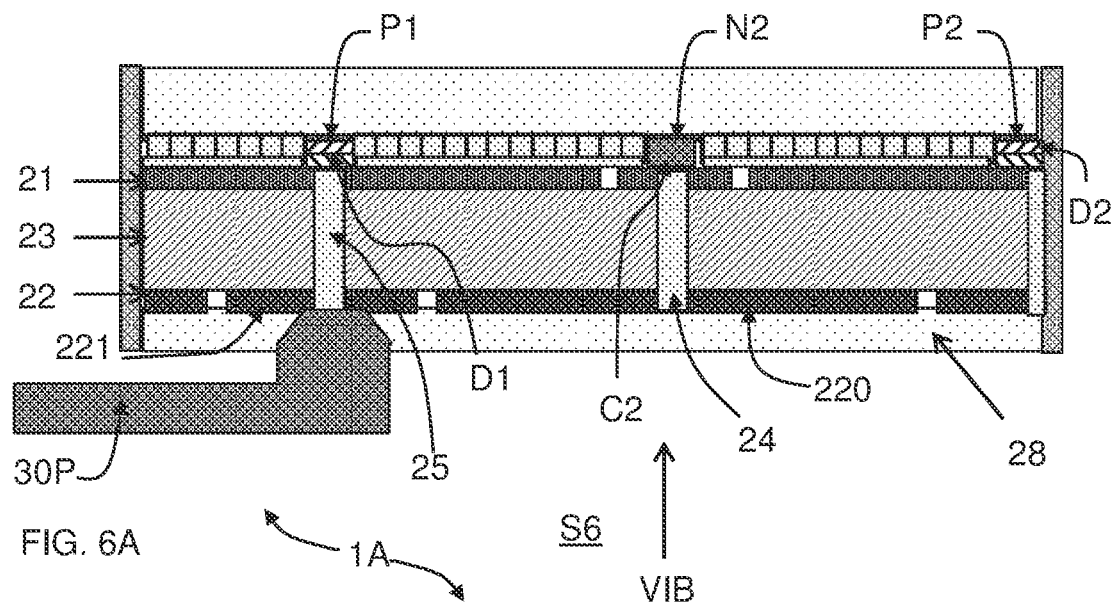
FIG. 6B shows a bottom-view of the product according to VIB in FIG. 6A FIGS. 7A and 7B schematically show an alternative version said further step. Therein
Figure 6B:
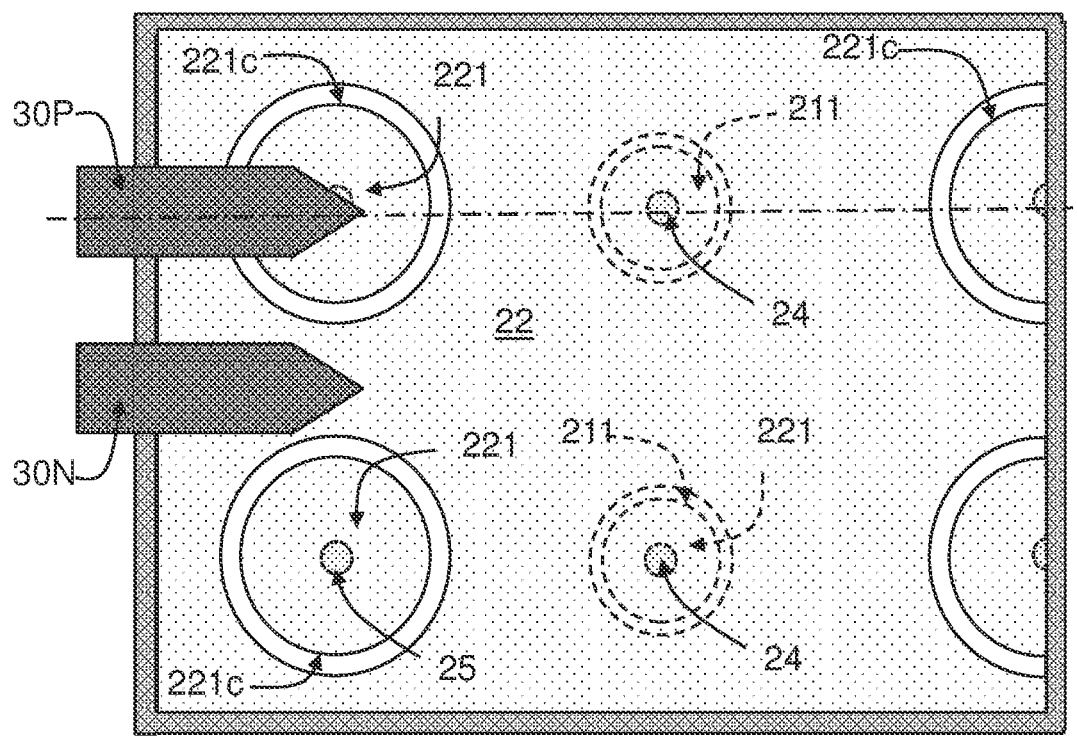

FIGS. 6A and 6B schematically show a further step S6. Therein FIG. 6B shows a bottom-view of the product according to VIB in FIG. 6A. In step S6 a first output clamp 30P is connected with a contact area 221 formed in the second electrically conductive layer 22. A second output clamp 30N is connected with the electrically conductive background domain 220 formed in the second electrically conductive layer 22. To this end, the clamps 30P, 30N, may for example be pressed through the protective layer 28 against their respective portion of the second electrically conductive layer 22. Alternatively, a solder connection may be provided as the electrical and mechanical contact between the clamps 30P, 30N, and their respective portion 221, 220 of the second electrically conductive layer 22. Before providing the connection, a portion of the protective layer 28 may be removed to expose those portions 221, 220 of the second electrically conductive layer 22. Optionally, as shown in FIG. 3GG, markings 281 on the protective layer 28 may serve as a guidance when performing step S6.

As noted above, regardless the dimensions of the separated photovoltaic product 1A, the output voltage has a fixed value. It may be desired however to limit the current which is delivered at the output clamps. This may for example be the case if the dimension of the separated photovoltaic product 1A in a direction transverse to the arrangement direction of the photovoltaic units 11A, 11B, etc is relatively large, in that case it can be decided to partition the background domain 220 of the first or the second electrically conductive layer 22 into mutually separate background domain portions, for example by removing material of the second electrically conductive layer 22 along an elongate region extending in the arrangement direction, e.g. by ablation through irradiation with a laser beam or by etching. This may for example take place in a manufacturing stage, for example during execution of step S24. The location of the regions where background domain portions are separated from each other may for example be indicated as further markings on the protective layer 28.

FIG. 3I1, 3I2 show an alternative way of arranging the diodes D1, D1'. Therein FIGS. 3I1 shows a cross-section and 3I2 shows a top-view of the electric support layer at a side where the photovoltaic stack is to be arranged. In the embodiment shown therein, the first electrically conductive layer 21 is provided with additional contact zones 213 for connection with the photovoltaic stack. The additional contact zones 213 are electrically insulated from the background domain 220 for example by a contour 213c where material of the electrically conductive layer 21 is removed, or is converted into an electrically non-conductive material. The diodes D1, D1' bridge the contour, having one terminal connected to the background domain 210 and another terminal connected to the contact zone 213.

Figure 7A:
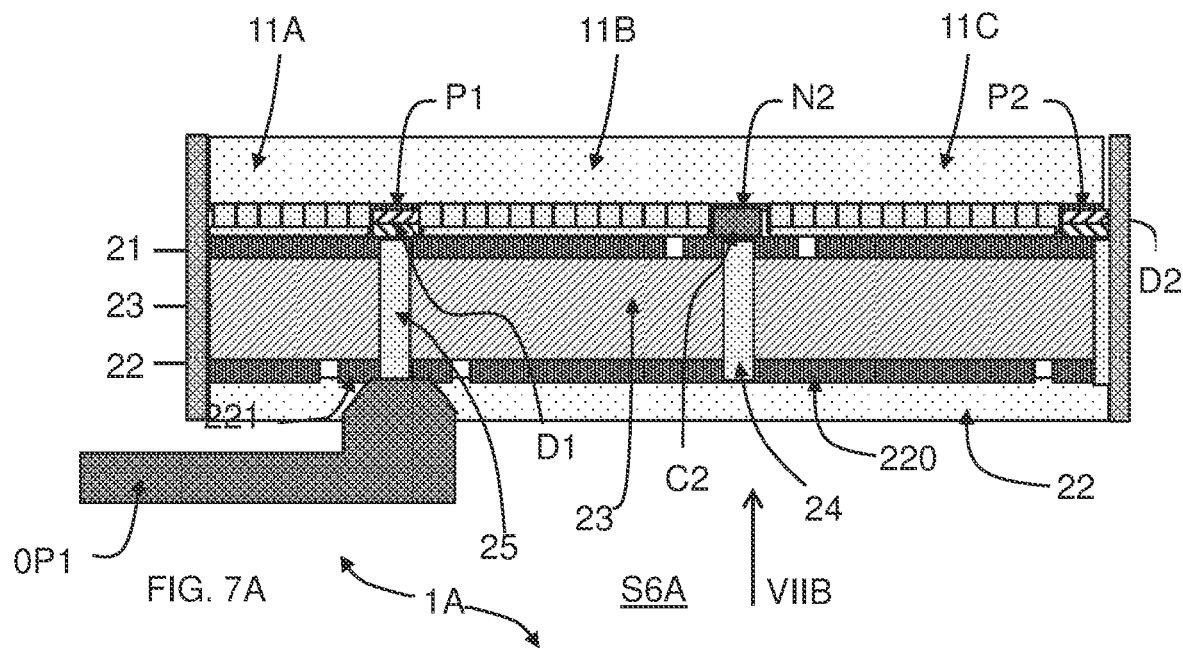
FIG. 7B shows a bottom-view of the product according to VIIB in FIG. 7A.
Figure 7B:
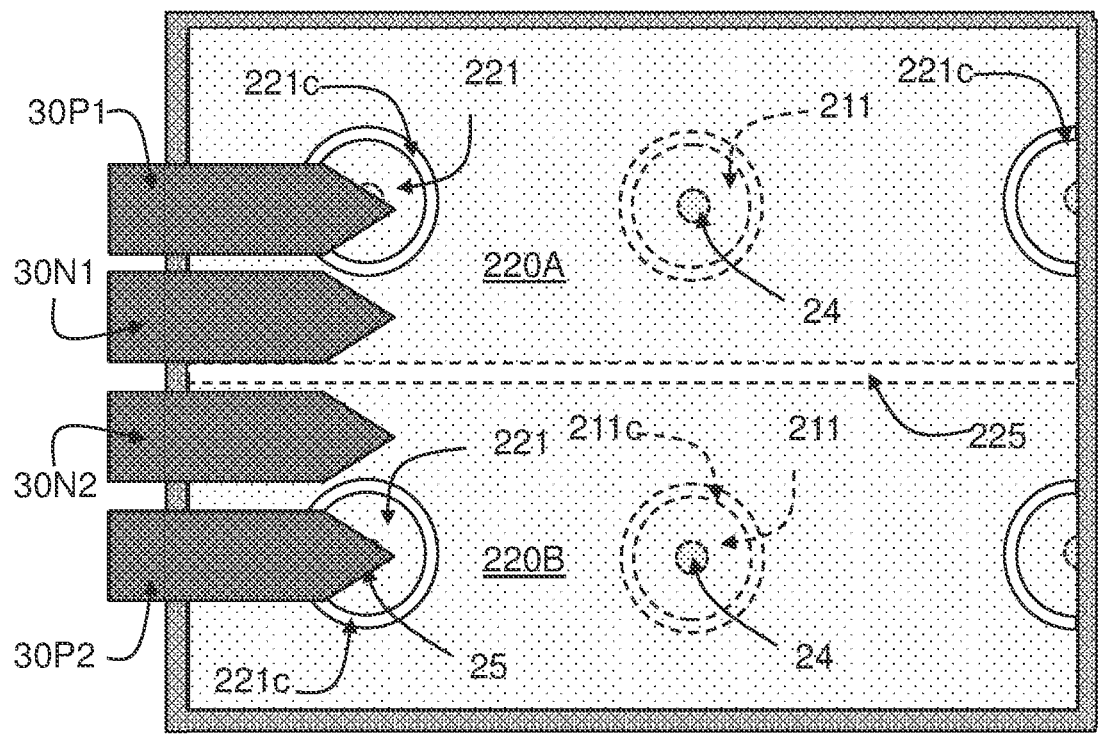

FIGS. 7A and 7B schematically show an alternative version S6A of further step S6 wherein the background domain 220 of the second electrically conductive layer 22 is partitioned into mutually separate background domain portions 220A, 220B by the elongate region 225. Therein FIG.

7B shows a bottom-view of the product according to VIIB in FIG. 7A. In this example, output clamps 30N1 and 30N2 are connected with a respective background domain portions 220A, 220B of the electrically conductive background domain Output clamps 30P1 and 30P2 are connected with a respective contact area 221, one within, but insulated from the first background domain portion 220A and the other one within, but insulated from the second background domain portion 220B. Therewith the current delivered during operation of the (separated) photovoltaic product 1A is split into a current delivered through the pair of output clamps 30P1, 30N1 and through the pair of output clamps 30P2, 30N2.

Figures 8, 8A, 8B:
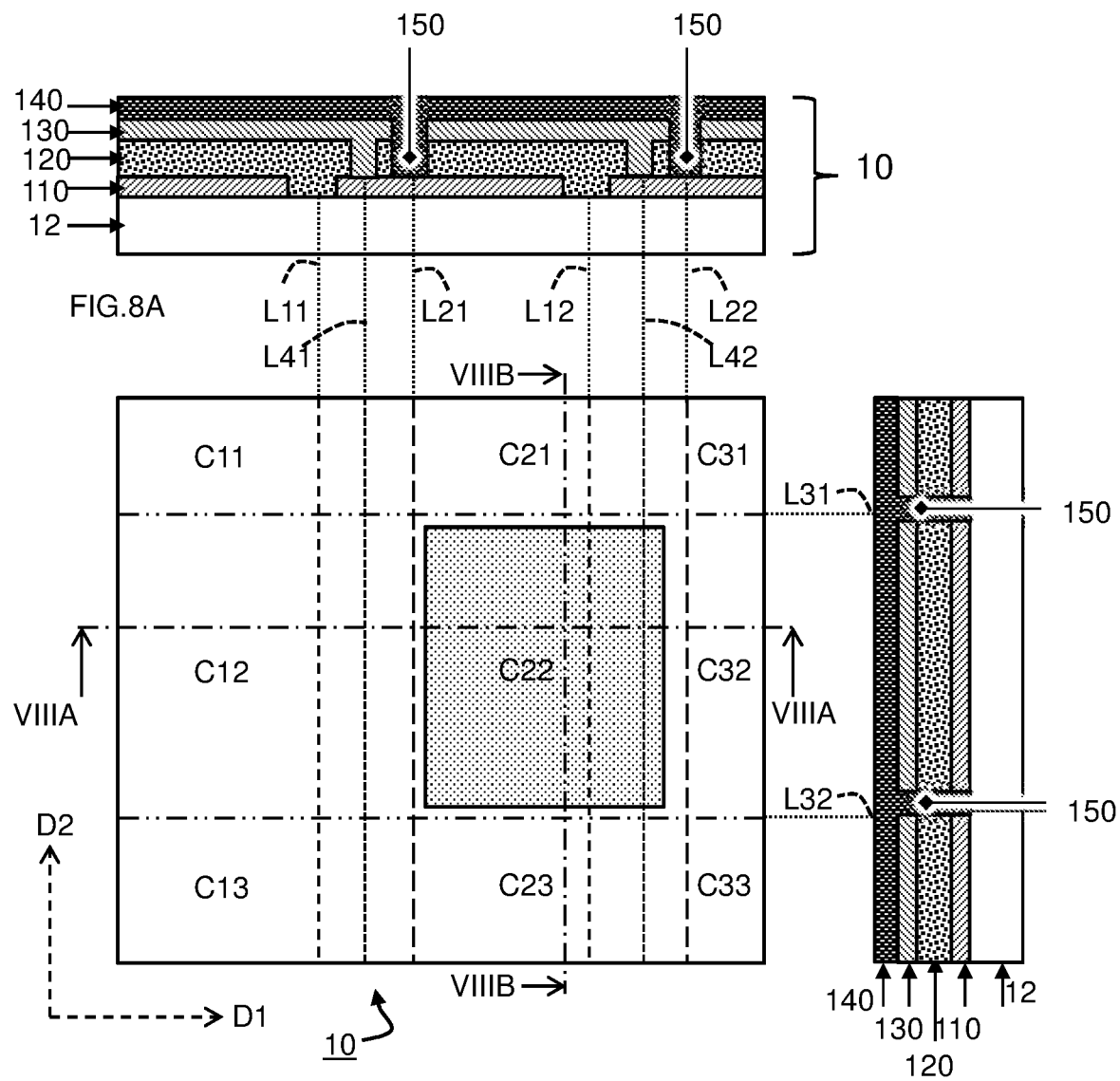
FIG. 8, 8A, 8B schematically show a portion of an exemplary photovoltaic layer stack

FIG. 8, 8A, 8B schematically show a portion of an exemplary photovoltaic layer stack 10 on a substrate 12 that subsequently comprises a first electrically conductive layer 110, a photovoltaic layer 120 of a photovoltaic material, for example a perovskite photovoltaic material and a second electrically conductive layer 130, and a protective coating 140 forming a barrier against moisture. Therein FIG. 8 show a view of the photovoltaic layer stack 10 at the side where it is to face the electrically conductive layer stack 20 and FIGS. 8A, and 8B respectively show a cross-section according to VIIIA-VIIIA in FIG. 8 and according to VIIIB-VIIIB in FIG. 8. As shown in particular in FIG. 8A, and as also schematically illustrated in FIG. 8, the first electrically conductive layer 110 is partitioned into distinct portions along first partitioning lines L11, L12 extending in a first direction D2. In practice a width of the first partitioning lines may be in a range of 100 nm to 500 micron. Nevertheless additional partitions may be provided which are separated at larger distances, e.g. a few cm. A space formed by the first partitioning lines may be filled with a filling material different from a material of the first electrically conductive layer 110. The filling material may be the perovskite photovoltaic material of the photovoltaic layer 120. This is advantageous in that a separate filling step in the manufacturing process is superfluous. Alternatively an insulator may be used as the filler material, which has the advantage that the partitioning lines can be relatively narrow. A partitioning of a layer does not necessarily imply a removal of material from the layer. Alternatively it is possible to convert a layer along a partitioning line, for example an electrically conductive layer may be partitioned into mutually insulated areas by rendering the material non-conductive along partitioning lines that separate the mutually insulated areas. E.g. an electrically conductive layer of SnOF (FTO) can be rendered non-conducting by a laser heating step that transforms the material to SnO.

As also shown in FIG. 8A, the second electrically conductive layer 130 and the photovoltaic layer 120 are partitioned along second partitioning lines L21, L22 extending in the first direction D2. The second electrically conductive layer 130 and the photovoltaic layer 120 are further partitioned along third partitioning lines L31, L32 that extend in a direction D1 different from direction D2. In an embodiment the directions D1, D2 are mutually orthogonal, but alternatively, these directions may differ by another angle, e.g. an angle selected in the range of 10 to 90 degrees.

As can be seen in FIGS. 8 and 8A, the first partitioning lines L11, L12 and the second partitioning lines L21, L22 alternate each other. Furthermore, a space 150 defined by the first partitioning lines L11, L12 and the third partitioning lines L31, L32 is filled with a protective filler material forming a barrier against moisture, therewith defining photovoltaic cells encapsulated by the protective material of the coating 140 and the protective filler material. In this embodiment the protective filler material in the space 150 is the same as the protective material of the coating. The protective material may for example comprise one or more of a ceramic material, such as SiN, Al2O3, TiO2, ZrO2. Also combinations are suitable, such as a combination of one of TiO2, ZrO2 with Al2O3. In manufacturing the protective material for the coating 140 and the space 150 may for example be provided in a single deposition process, e.g. by a CVD process or an (s)ALD process. In the embodiment shown the depth of the first partitioning lines L11, L12 and the third partitioning lines L31, L32 may for example be in the range of 100 nm to 200 micron, and a width may be in a range of 1 micron to 50 centimeter. In the embodiment shown fourth partitioning lines L41, L42 are provided in the direction D2, one between each first partitioning line and a subsequent second partitioning line. The fourth partitioning lines L41, L42 provide a space for an electrical connection between a portion of the second electrically conductive layer 130 defined by a cell (e.g. C12) and a portion of the first electrically conductive layer 10 defined by a neighboring cell (e.g. C22). A suitable width of this space is for example in the order of 10 to 80 micron. The electrical connection may be provided by the electrically conductive material of the second electrically conductive layer 130 onto a surface of the first electrically conductive layer 110, or by another electrically conductive material in the space provided by the fourth partitioning lines. Therewith a series arrangement is formed of the cells C11, C12, C13 arranged along the second direction D1. These are still connected by electrode 10 in this configuration. More examples can be found in PCT/NL2018/050521, which was previously filed by the same applicant.

Figure 9A:
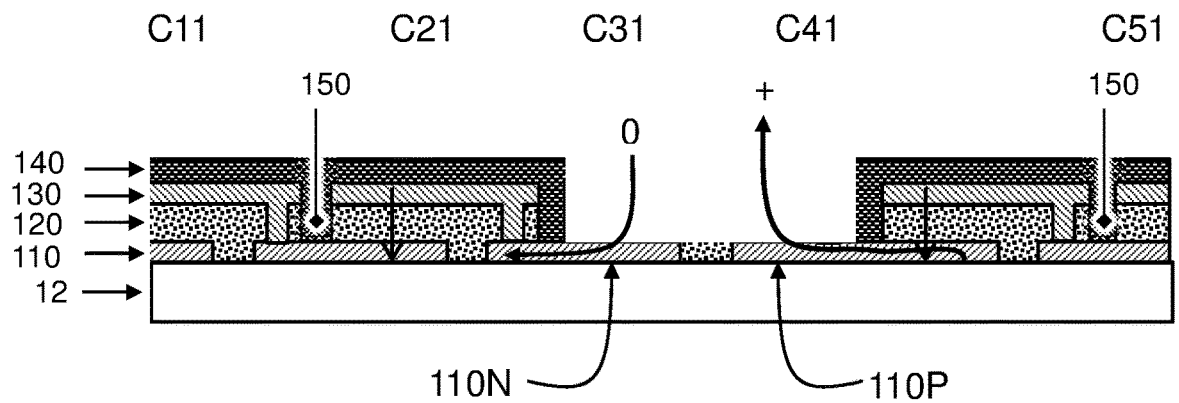
FIG. 9A shows an exemplary method to provide the photovoltaic layer stack of FIGS. 8, 8A and 8B with electrical connections. An alternative approach is shown in FIG. 9B, 9C.

FIG. 9A shows an exemplary method to provide the photovoltaic layer stack of FIGS. 8, 8A and 8B with electrical connections.

In the example of FIG. 9A, a portion of the first electrically conductive layer 110 is exposed at the boundary of two mutually subsequent photovoltaic device cells C31, C41. Therewith a respective portion of the first electrically conductive layer 110 of each of these device cells C31, C41 is exposed. In this example, where the first electrically conductive layer 110 portions form the anode, the portion proper to device cell C31 forms a neutral contact 110N to a set of serially arranged photovoltaic device cells C21, C11, etc and the portion proper to device cell C41 forms a positive contact 110P to a set of serially arranged photovoltaic device cells C51, . . . , etc. In case that the first electrically conductive layer 110 portions form the cathode, the polarity of the contacts is reversely defined. To form the contacts it is necessary to (at least partially) remove material from the other layers of at least the device cells C31. It is noted that in this embodiment a positive and neutral contact 110N, 110P are relatively close to each other. This may complicate forming electric connections with their corresponding contacts in the first electrically conductive layer 21 of the electrically conductive layer stack 20. It may be contemplated to not expose the contacts at the first electrically conductive layer 110 portions of directly subsequent photovoltaic device cells C31, C41, but instead select a pair of cells that is further apart, for example the pair of cells C21, C41. However, in that case the intermediary cells, would also disappear, or at least become dysfunctional, which is at the cost of device efficiency.

Figure 9B:
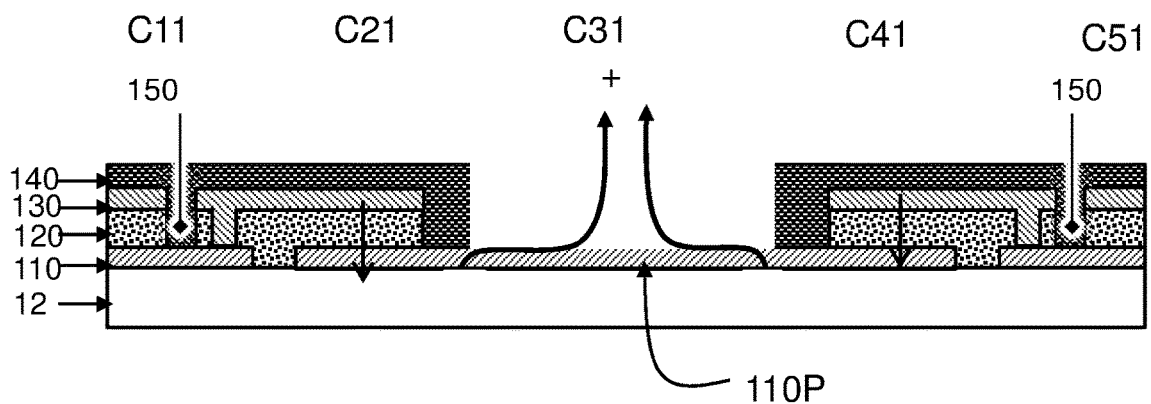
Figure 9C:
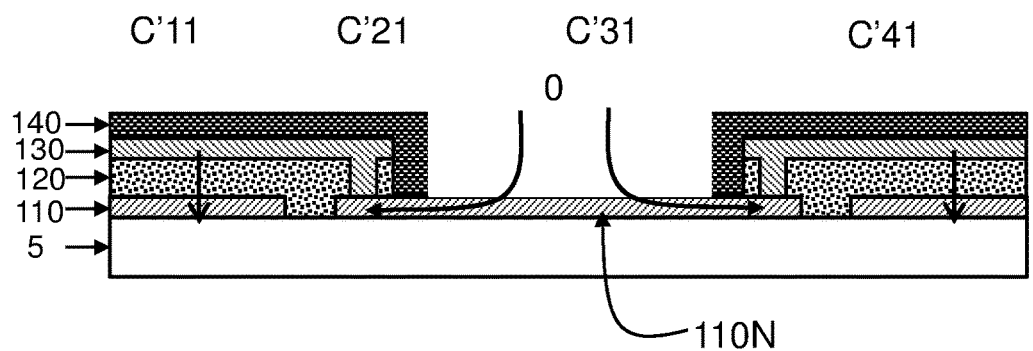

An alternative approach is shown in FIG. 9B, 9C. In this case mutually subsequent photovoltaic units share a respective common electrical contact. This is rendered possible in that the polarity of the photodiodes Dp is reversed at each boundary between a photovoltaic unit e.g. 11A and its direct successor, 11B, as is schematically shown in FIG. 2AB. In this example, photovoltaic device cells C11, and C21, may for example be the last two photodiodes of photovoltaic unit 11A, and photovoltaic device cells C41, and C51, may for example be the first two photodiodes of photovoltaic unit 11B. In FIG. 9C, photovoltaic device cell C'11 may be the last photodiode of photovoltaic unit 11B and C'41 may be the first photodiode of photovoltaic unit 11C. In this way is single contact suffices between each pair of photovoltaic units 11A, 11B; 11B, 11C etc. Therewith the distance between the contacts can be relatively large as the are separated by photovoltaic unit, while avoiding that the functionality of the intermediate photovoltaic cells is impaired. Hence the large separating space is efficiently used.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

The invention claimed is:

1. Photovoltaic product comprising:
a foil with a photovoltaic layer stack; and
an electrically conductive layer stack that supports the photovoltaic layer stack and that, in an operational state, provides for a transport of electric energy generated by the photovoltaic layer stack to an external load,
wherein the electrically conductive layer stack comprises:
a first electrically conductive layer;
a second electrically conductive layer; and
an electrically insulating layer arranged between the first electrically conductive layer and the second electrically conductive layer,
wherein the first electrically conductive layer comprises:
a first electrically conductive background domain; and
a first plurality of laterally distributed, mutually distinct contact areas that are electrically insulated from the first electrically conductive background domain;
wherein the second electrically conductive layer comprises:
a second electrically conductive background domain; and
a second plurality of laterally distributed, mutually distinct contact areas that are electrically insulated from the second electrically conductive background domain;
wherein the electrically conductive layer stack further comprises:
a first plurality of laterally distributed electrically conducting vias that electrically interconnect respective ones of the first plurality of contact areas with the second electrically conductive background domain;
a second plurality of laterally distributed electrically conducting vias that electrically interconnect respective ones of the second plurality of contact areas with the first electrically conductive background domain;
wherein the photovoltaic layer stack has comprises:
first electrical contacts of a first polarity that are electrically connected to the first electrically conductive background domain; and
second electrical contacts of a second polarity opposite to said first polarity that are electrically connected to the first contact areas, and
wherein the second electrically conductive background domain and one or more of the second contact areas serve as electric contacts for connecting the photovoltaic product to an external load.

2. The photovoltaic product of claim 1, wherein the second contact areas are at least twice as large as the first contact areas.

3. The photovoltaic product of claim 1, wherein the photovoltaic layer comprises a plurality of photovoltaic units that are arranged in an arrangement direction, such that mutually subsequent photovoltaic units share a respective common electrical contact.

4. The photovoltaic product according to claim 3, further comprising diodes that are arranged:
between the first electrical contacts and the first electrically conductive background domain; and/or
between the second electrical contacts and the first contact areas,
wherein the diodes are biased in accordance with current direction as determined by the plurality of photovoltaic units in their normal operational state.

5. The photovoltaic product according to claim 1, wherein the first electrically conductive background domain and/or the second electrically conductive background domain is partitioned into mutually separate background domain portions which that are separated from each other through an elongate region free from electrically conductive material extending in a direction transverse to an arrangement direction in which the photovoltaic units succeed each other.

6. The photovoltaic product according to claim 5, further comprising a respective pair of output clamps attached at each lateral portion of the photovoltaic product corresponding to a proper one of the background domain portions of the first electrically conductive background domain and the second electrically conductive background domain.

7. A method of manufacturing a photovoltaic product, comprising:
providing a photovoltaic layer stack having a plurality of photovoltaic units, and having first electrical contacts of a first polarity and second electrical contacts of a second polarity opposite t//o said first polarity;
providing an electrically conductive layer stack;
laminating the photovoltaic layer stack on the electrically conductive layer stack;
wherein the providing an electrically conductive layer stack comprises:
providing an insulating layer with a first electrically conductive layer and a second electrically conductive layer at respective ones of mutually opposite surfaces of the insulating layer;
providing a first plurality of laterally distributed electrically conducting vias that electrically interconnect the first electrically conductive layer and the second electrically conductive layer;
providing a second plurality of laterally distributed electrically conducting vias that electrically interconnect the first electrically conductive layer and the second electrically conductive layer;

removing material of the first electrically conductive layer along a contour of a zone around each via of the first plurality, to partition the first electrically conductive layer into:
- a first electrically conductive background domain, and
- a first plurality of laterally distributed, mutually distinct contact areas that are electrically insulated from the first electrically conductive background domain;

removing material of the second electrically conductive layer along a contour of a zone around each via of the second plurality, to partition the second electrically conductive layer into:
- a second electrically conductive background domain, and
- a second plurality of laterally distributed, mutually distinct contact areas which that are electrically insulated from the second electrically conductive background domain; and wherein said laminating comprises interconnecting the first electrical contacts of the photovoltaic layer stack with the first electrically conductive background domain of the first electrically conductive layer and interconnecting the second electrical contacts to respective first contact areas of the first electrically conductive layer.

8. The method of claim 7, comprising arranging diodes at the first electrically conductive background domain at the locations determined for interconnection with the first electrical contacts of the photovoltaic layer stack and/or at the locations of the first contact areas for interconnection with the second electrical contacts of the photovoltaic layer stack.

9. The method of claim 7, comprising applying a layer of a polymer melt material on the first electrically conductive layer as an interface between the electrically conductive layer stack and the photovoltaic layer stack to be laminated therewith.

10. The method of claim 7, comprising providing a protective layer over the second electrically conductive layer.

11. The method of claim 10, comprising providing the protective layer with markings, each marking being indicative of a location of one or more of the contact areas in the second electrically conductive layer.

12. The method according to claim 7, comprising, separating a lateral portion of the photovoltaic product, to obtain a separated photovoltaic product.

13. The method according to claim 7, comprising partitioning the first electrically conductive background domain and/or the second electrically conductive background domain into mutually separate background domain portions by removing material of the first and/or the second electrically conductive layer along an elongate region extending in a direction transverse to an arrangement direction in which the photovoltaic units succeed each other.

14. The photovoltaic product of claim 1 wherein the second electrically conductive background domain and one or more of the second contact areas serve as electric contacts for connecting the photovoltaic product to an external load via output clamps.

\* \* \* \* \*